United States Patent [19]

Schenck

[11] Patent Number: 4,617,516

[45] Date of Patent: Oct. 14, 1986

[54] AXIAL MAGNETIC FIELD GRADIENT COIL SUITABLE FOR USE WITH NMR APPARATUS

[75] Inventor: John F. Schenck, Schenectady, N.Y.

[73] Assignee: General Electric Company, Schenectady, N.Y.

[21] Appl. No.: 529,431

[22] Filed: Sep. 6, 1983

[51] Int. Cl.[4] ............................................. G01R 33/08
[52] U.S. Cl. ................................... 324/318; 324/307; 324/319; 324/309
[58] Field of Search ............... 324/307, 309, 313, 318, 324/319, 320, 321, 301, 302, 303, 304; 335/299, 216, 213, 282; 336/15, 136, 171, 180, 181, 224

[56] References Cited

U.S. PATENT DOCUMENTS

| | | | |
|---|---|---|---|
| 2,929,017 | 3/1960 | Seaton | 336/136 |
| 3,113,280 | 12/1963 | Hobley | 336/136 |
| 4,157,495 | 6/1979 | Grover | 324/302 |
| 4,319,190 | 3/1982 | Brown | 324/313 |
| 4,456,881 | 6/1984 | Compton | 324/319 |
| 4,467,282 | 8/1984 | Siebold | 324/318 |
| 4,468,622 | 8/1984 | Frese | 324/318 |
| 4,480,228 | 10/1984 | Bottomley | 324/307 |
| 4,486,711 | 12/1984 | Frese | 324/319 |

FOREIGN PATENT DOCUMENTS

322499  7/1920  Fed. Rep. of Germany ...... 336/224

OTHER PUBLICATIONS

Proceedings of an International Symposium on NMR Imaging (Oct. 1-3, 1981) by Hanley, "Superconducting and Resistive Magnets in NMR Scanning", pp. 41-49.
Proceedings of an International Symposium on NMR Imaging (Oct. 1-3, 1981) by Bottomley-"Instrumentation for Whole Body Imaging", pp. 25-31.
J. F. Schenck et al., "Formulation of Design Rules for NMR Imaging Coil by Using Symbolic Manipulation", Proceedings of the 1981 ACM Symposium on Symbolic and Algebraic Computation, pp. 85-93, Association for Computing Machinery, New York (1981).
W. R. Smythe, *Static and Dynamic Electricity*, (3rd Ed.), pp. 180, 291 and 335, McGraw-Hill, New York (1968).
M. W. Garrett, "Thick Cylindrical Coil Systems for Strong Magnetic Fields with Field or Gradient Homogeneities of the 6th to 20th Order," *Journal of Applied Physics*, vol. 38, No. 6, pp. 2563-2586 (1967).
W. D. MacMillan, *The Theory of the Potential*, pp. 371-373, Dover, New York (1958).

*Primary Examiner*—Stephen A. Kreitman
*Assistant Examiner*—Scott M. Oldham
*Attorney, Agent, or Firm*—Geoffrey H. Krauss; James C. Davis, Jr.; Marvin Snyder

[57] ABSTRACT

A cylindrical coil for providing a magnetic field having a substantially linear gradient in an axial direction within the volume of the cylinder, as can be utilized in NMR apparatus, includes a cylindrical coil support structure and electrically conductive winding turns wound on the outer surface of the support structure. The winding turns are electrically insulated from each other and are located such that the axial density of the winding turns increases linearly from the center of the coil to each axial end thereof. Preferably, the winding turns are located so that the angular position $\phi$ of the spiral path of the windings on the surface of the cylindrical support structure satisfies the relationship determined by the equation $$\frac{d\phi}{dZ} = \frac{4\pi a^2}{\mu_0} \frac{G_z}{I} \sigma_\phi(Z).$$

The coil may also include additional electrically conductive winding turns for compensating for variations in the linearity of the magnetic field gradient which are due to the coil being of finite length. Coils in accordance with the instant invention may be utilized to provide an improved nuclear magnetic resonance imaging and analysis system.

13 Claims, 6 Drawing Figures

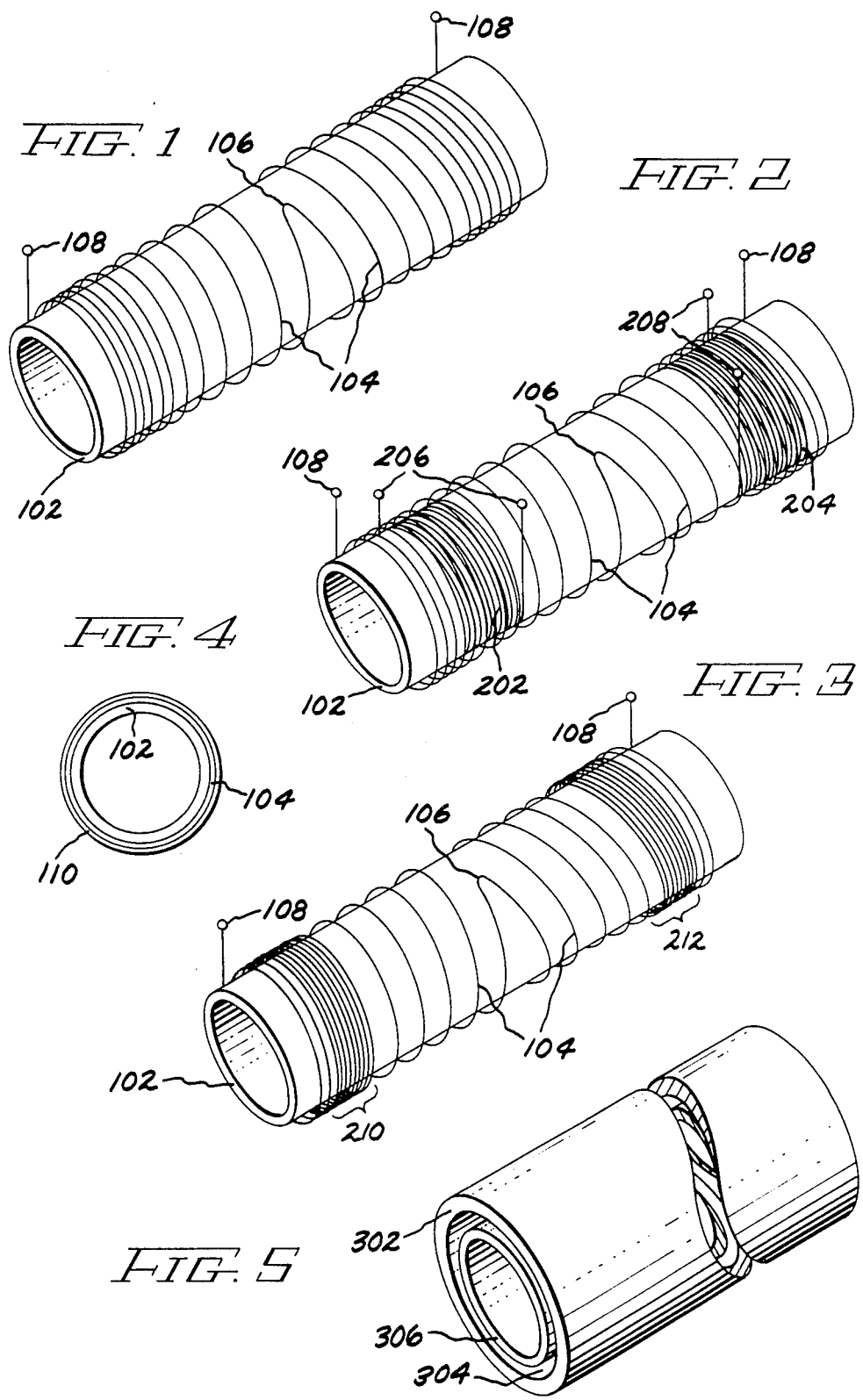

AXIAL MAGNETIC FIELD GRADIENT COIL SUITABLE FOR USE WITH NMR APPARATUS

BACKGROUND OF THE INVENTION

This invention relates to a cylindrical coil which provides a magnetic field having a substantially linear gradient in an axial direction within the volume of the cylinder. More specifically, this invention relates to a cylindrical coil which provides a magnetic field having a substantially linear gradient in an axial direction within the volume of the cylinder so as to be useful for obtaining spatial information for nuclear magnetic resonance NMR imaging.

In NMR imaging, a homogeneous magnetic field $B_0$ is directed along the positive z-axis of a Cartesian coordinate system whose origin is typically near the center of the sample to be imaged. The Z-axis is selected to be coincident with the longitudinal axis of a typically cylindrical sample volume. The effect of the static magnetic field $B_0$ is to polarize nuclear spins having net magnetic moments so that at equilibrium a greater number of nuclear spins align with the $B_0$ field and produce a macroscopic magnetization M. This polarization allows a resonant response of the nuclear spins when excited by radio frequency (RF) magnetic field pulses. When RF pulses of appropriate frequency and direction are applied to the sample, nuclei of the sample are excited by the RF energy and individual polarized nuclear spins (and hence magnetization M) precess about the axis of the field $B_0$, at a frequency $\omega$ given by the equation $\omega = \gamma B_0$, in which $\gamma$ is the gyromagnetic ratio for the isotope or isotopes being studied. The absorbed energy is detected as an NMR signal in the form of an RF magnetic field resulting from the precession of the nuclei.

Magnetic field gradients are used in NMR imaging systems to encode spatial information into the NMR signal. Typically three orthogonal magnetic field gradients are used, corresponding to the three axes of the Cartesian coordinate system. If the strength of the component of a magnetic field along the direction of one of those axes is a function of position within an imaging volume, then so is the resonant frequency of the nuclear spins.

If the magnetic field gradient is linear, the frequency spectrum for the spins is a one-dimensional projection of the NMR signal distribution along the direction of the field gradient. Thus, each value of the magnetic field corresponds to one location along the axis of the field. Accordingly, if the value of the magnetic field is the same at two or more different locations along the axis, the NMR signals for those locations are combined, resulting in degradation of the NMR signal data and image artifacts. Similarly, magnetic field gradients which are non-linear can cause geometric distortions of the image. Thus, magnetic field gradients which are highly linear are desirable.

More complete treatments of basic NMR concepts are provided in a recent text edited by Leon Kaufman et al., entitled "Nuclear Magnetic Resonance Imaging and Medicine", Igaku-Shoin, New York in Tokyo (1981), and also in an earlier text by Thomas C. Farrar et al., entitled "Pulse and Fourier Transform NMR, An Introduction to Theory and Methods", Academic Press, New York (1971), which are incorporated herein by reference as background material.

In NMR whole-body imaging it is convenient to wind the coils for the magnetic field gradients on a cylindrical surface, because the openings at the ends of the cylinder provide a means of access through which the patient can be introduced into the imaging volume. In such a system, the central axis of the cylinder is aligned with the Z-axis of the imaging system referred to above. Thus, a coil design is desired that produces a magnetic field $B_z$ that is linearly graded along the Z-axis, that is, a field in the Z-direction of the form $B_z = G_z Z$, where $G_z$, the field gradient, is a constant. Different coil designs and magnetic fields may be effected by selecting different surface current density patterns on the cylindrical coil surface. A number of coil arrangements have been proposed to approximate a linearly graded magnetic field, but they all produce magnetic field gradients which contain non-linear terms that lead to both axial and radial distortions in the field. For example, a coil made from Maxwell pairs has been used in the past to provide magnetic field gradients. While such coils are capable of providing a nearly linear field gradient at the center of the cylinder, the field gradient becomes non-linear at distances from the center which are more than approximately one-half the radius of the cylinder. It is not practical merely to make the coil larger in an attempt to increase the area of linearity because, for whole-body imaging, it is already very large in terms of the magnet system needed to produce the high $B_0$ field required for NMR imaging.

Another problem with coils that have been used in the past to provide magnetic field gradients is the relatively high electrical inductance of such coils. The pulse sequences used in NMR imaging require coils that are capable of being rapidly switched between high current and low current conditions. Therefore, coils having low electrical inductance are desired.

It is an object of the present invention to provide a cylindrical coil having a substantially linearly graded magnetic field within the interior volume thereof.

It is a further object of the present invention to provide a magnetic field gradient coil having low electrical inductance.

It is also an object of the present invention to provide a cylindrical magnetic field gradient coil especially suitable for use with NMR apparatus.

SUMMARY OF THE INVENTION

A cylindrical coil for providing a magnetic field having a substantially linear gradient in an axial direction within the interior volume of the cylinder, 25 can be utilized in NMR apparatus, comprises a cylindrical coil support structure and electrically conductive winding turns disposed on the surface of the support structure. The winding turns are electrically insulated from the support structure and/or from one another and are located such that the axial density of the winding turns (as measured, for example, in turns per inch) increases linearly from the center of the coil to each axial end thereof. The winding turns are further disposed so that the angular position $\phi$ on the surface of the cylindrical support structure satisfies the relationship determined by the equation $$\frac{d\phi}{dZ} = \frac{4\pi a^2}{\mu_o} \frac{G_z}{I} \sigma_\phi(Z)$$

where a is the radius of the coil support structure, $Z=z/a$ is the normalized axial position along the axis of the coil, $\mu_o$ is the permeability of free space, $G_z$ is the value of the magnetic field gradient within the interior volume of the coil in a direction parallel to the axis of the coil, I is the current flowing through the winding turns, and $\rho_\phi(Z)$ is a dimensionless shape function characterizing the number of winding turns per unit length of coil as a function of Z. Preferably, the coil further comprises additional electrically conductive winding turns for compensating for variations in the linearity of the magnetic field gradient within the interior volume of the coil which are due to the coil being of finite length.

An improved nuclear magnetic resonance imaging system utilizes a cylindrical coil in accordance with the instant invention to provide a magnetic field linearly graded in the direction of the central axis of the system. The imaging system further includes a means for providing a uniform high strength magnetic field along the same central axis, a means for providing linearly graded magnetic fields along two axes substantially orthogonal to the central axis and at a non-zero angle to each other, a means for generating and transmitting radio frequency signals having the required modulation to excite nuclear resonance in the sample being imaged, a means for receiving and processing the resulting NMR signals, and a means for generating images from the processed signals.

BRIEF DESCRIPTION OF THE DRAWINGS

The subject matter which is regarded as the invention is particularly pointed out and distinctly claimed in the concluding portion of the specification. The invention itself, however, both as to its organization and its method of practice, together with further objects and advantages thereof, may best be understood by reference to the following description taken in conjunction with the accompanying drawings, in which:

FIG. 1 is a perspective view of a cylindrical coil in accordance with one embodiment of the present invention;

FIG. 2 is a perspective view of a cylindrical coil in accordance with another embodiment of the present invention;

FIG. 3 is a perspective view of a cylindrical coil in accordance with a preferred embodiment of the present invention;

FIG. 4 is an end view schematically illustrating yet another embodiment of the present invention;

FIG. 5 is a perspective view schematically depicting a magnetic field generating system for nuclear magnetic resonance imaging utilizing the cylindrical coil of the present invention.

DETAILED DESCRIPTION OF THE INVENTION

Figure 6:
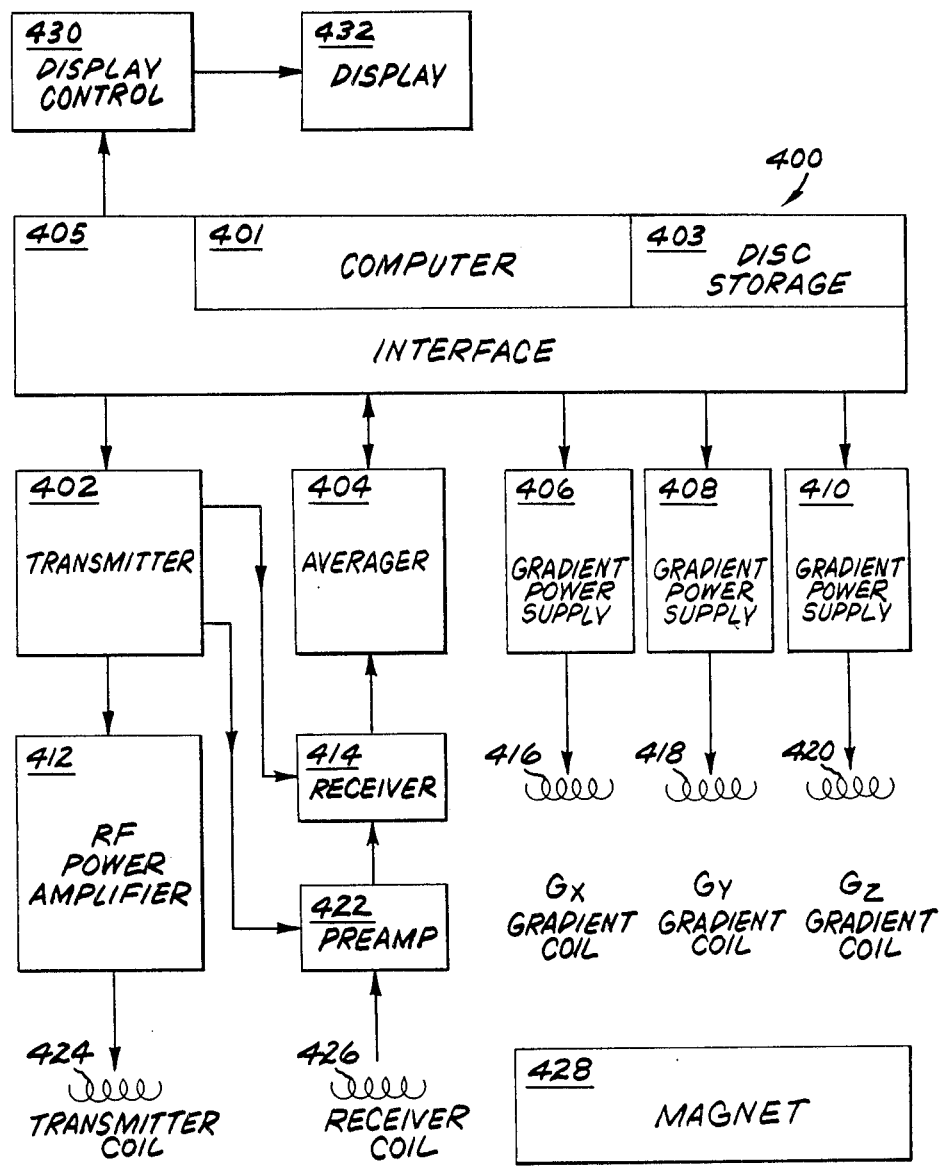
FIG. 6 is a simplified block diagram showing the major components of an NMR imaging apparatus suitable for utilizing the cylindrical coil of the present invention.

By mathematical analysis of magnetic field configurations, a winding turn density localized to a cylindrical surface has been developed that produces a linear $B_z$ gradient field. To aid in the understanding of applicant's invention, the analysis used in developing the cylindrical coils claimed by applicant is outlined below.

In free space each Cartesian component of the magnetic flux density B, and of the magnetic vector potential A, satisfies the Laplace equation. Therefore, each of the Cartesian components can be written as a superposition of solid spherical harmonic functions. Equations have been developed that permit the X, Y, or Z differentiation of any solid spherical harmonic function to produce an expression consisting of solid spherical harmonics of lower order. These equations are presented in Table I.

TABLE I

Cartesian Derivatives for the Solid Spherical Harmonics.

$$\frac{\partial}{\partial z} r^n C_{mn} = (n+m)r^{n-1}C_{m,n-1}$$

$$\frac{\partial}{\partial x} r^n C_{mn} = -\frac{1}{2} r^{n-1}C_{m+1,n-1} + \frac{(n+m)(n+m-1)}{2} r^{n-1}C_{m-1,n-1} \quad m \neq 0$$

$$\frac{\partial}{\partial z} r^n S_{mn} = (n+m)r^{n-1}S_{m,n-1}$$

$$\frac{\partial}{\partial x} r^n S_{mn} = -\frac{1}{2} r^{n-1}S_{m+1,n-1} + \frac{(n+m)(n+m-1)}{2} r^{n-1}S_{m-1,n-1}$$

$$\left.\begin{array}{l}\frac{\partial}{\partial x} r^n C_{0n} = -r^{n-1}C_{1,n-1} \\ \frac{\partial}{\partial y} r^n C_{0n} = -r^{n-1}S_{1,n-1}\end{array}\right\} m = 0$$

$$\frac{\partial}{\partial y} r^n C_{mn} = -\frac{1}{2} r^{n-1}S_{m+1,n-1} - \frac{(n+m)(n+m-1)}{2} r^{n-1}S_{m-1,n-1}$$

$$\frac{\partial}{\partial y} r^n S_{mn} = \frac{1}{2} r^{n-1}C_{m+1,n-1} + \frac{(n+m)(n+m-1)}{2} r^{n-1}C_{m-1,n-1}$$

The notation for the spherical harmonics is taken from pages 371–373 of the textbook of W. D. MacMillan, *The Theory of the Potential*, Dover, N.Y., 1958. From an article by J. F. Schenck and M. A. Hussain, entitled "Formulation of Design Rules for NMR Imaging Coil by using Symbolic Manipulation", *Proceedings of the 1981 ACM Symposium on Symbolic and Algebraic Computation*, pp. 85–93, Association for Computing Machinery, New York, 1981, it can be shown that a $B_Z$ field proportional to Z is proportional to a particular solid spherical harmonic function $$B_z = G_z r C_{01}(\theta,\phi) \quad (1)$$

where $G_z$ is a constant.

For a linearly graded magnetic field, a magnetic vector potential A is desired such that $B_z$ contains only the term $rC_{01}$. It is seen from the differentiation formulas that only harmonics of the form $r^2C_{12}=xz$ and $r^2S_{12}=yz$ can be permitted in the expansion of the $A_x$ and $A_y$ components of the magnetic vector potential. The presence of any other terms would produce $B_z$ fields that are not proportional to z. The $A_z$ component of A does not affect the $B_z$ field and can be ignored or taken equal to zero. To determine the necessary surface current density to produce a vector potential of the above form within the cylinder, a boundary condition is used. The internal vector potential is matched to an external vector potential such that each component of the magnetic vector potential is continuous across the cylindrical surface. The surface current denstiy can be written as $$\overline{\lambda} = \lambda_\phi \hat{\phi} + \lambda_z \hat{\kappa} \tag{2}$$

where the dimensions of $\lambda$ are amperes per meter. Using the boundary condition above, $$\mu_o \lambda_\phi = (B_{inside} - B_{outside})_z$$

$$\mu_o \lambda_z = -(\overline{B}_{inside} - \overline{B}_{outside})_\phi \tag{3}$$

or, in vector form $$\mu_o \lambda = (\overline{B}_{inside} - \overline{B}_{outside}) \times \hat{\rho} \text{ (at the cylindrical surface)}.$$

Using the harmonic functions for infinitely long cylinders set forth as Equation 8 on page 180 of the textbook by W. R. Smythe, *Static and Dynamic Electricity* (3rd Edition), McGraw-Hill, New York, 1968, the form for the components of the magnetic vector potential can be determined. The solutions are Internal Solutions:

$$\rho^n [A \cos m\phi + B \sin m\phi][Cz + D] \tag{4}$$

External Solutions:

$$\frac{a^{2n}}{\rho^n} [A' \cos m\phi + B' \sin m\phi][C'z + D'] \tag{5}$$

where A, B, C, D, A', B', C', and D' are arbitrary constants to be determined. For a constant gradient magnetic field, the magnetic vector potential is written in the form (inside)

$$\overline{A} = \frac{G_z}{2} [-yz\hat{i} + xz\hat{j}] = \frac{G_z z\rho \hat{\phi}}{2} \text{ (inside)}. \tag{6}$$

To maintain continuity and to obey Equations 4 and 5, $$\overline{A} = \frac{G_z}{2} \frac{Za^2}{\rho} \hat{\phi} \text{(outside)}. \tag{7}$$

Taking the curl of Equations 6 and 7, $$\overline{B} = \frac{-G_z \rho}{2} \hat{\rho} + G_z z \hat{\kappa} \text{(inside)} \tag{8}$$

$$\overline{B} = \frac{-G_z a^2}{2\rho} \hat{\rho} \text{(outside)}.$$

From Equations 3 and 8 the solution for the surface current density is obtained as $$\lambda_\phi = \frac{G_z z}{\mu_o}. \tag{9}$$

Thus, the desired constant gradient magnetic field can be produced by a linearly increasing current density, with a sign reversal at the origin. There will be a radial B field which is required to make the divergence of B equal to zero. However, this radial field will not affect NMR imaging applications. The magnetic field lines produced by the above surface current density satisfy the differential equations

| (INSIDE) | (OUTSIDE) | |
|---|---|---|
| $B_z = G_z z$ | $B_z = 0$ | (10) |
| $B_\rho = -\dfrac{G_z \rho}{2}$ | $B_\rho = -\dfrac{G_z a^2}{2\rho}$ | |
| $\dfrac{\partial z}{\partial \rho} = -\dfrac{2z}{\rho}$ | $\dfrac{\partial z}{\partial \rho} = 0$ | |

Integrating these differential equations, the field lines that pass through the cylindrical surface at $Z = Z_c$ are found to have the form $$z = z_c \text{ (outside)} \tag{11}$$

$$z = z_c \sqrt{a/\rho} \text{ (inside)}$$

where $Z_c$ is a constant for each field line. The field produced by these field lines can be conveniently represented by an expression in solid spherical harmonic functions about the center of the coil system as $$B_z = \sum_{n=1}^{\infty} A_{0n} r^n P_n(\cos\theta). \tag{12}$$

(n odd)

Thus, the field produced is of the form $$B_z = A_{01}\left(\frac{r}{a}\right) C_{01} + A_{03}\left(\frac{r}{a}\right)^3 C_{03} + A_{05}\left(\frac{r}{a}\right)^5 C_{05} + \tag{13}$$

$$A_{07}\left(\frac{r}{a}\right)^7 C_{07} + \ldots$$

For a linearly graded magnetic field, $A_{01}$ is equal to a constant and $A_{03}$, $A_{05}$, $A_{07}$, etc., all equal zero. The expansion coefficients $A_{0n}$ are given by $$A_{0n} = \frac{\mu_o I}{2a} \frac{g_{on}(Z)}{(1 + Z^2)^{\frac{(2n+3)}{2}}}. \tag{14}$$

Therefore, when integrating the function $$f_n(Z) = \frac{g_{0n}(Z)}{(1 + Z^2)^{\frac{(2n+3)}{2}}} \tag{15}$$

from zero to infinity, a non-zero value for $A_{01}$ should be obtained, but a value of zero should be obtained for all higher terms. From pages 86 and 87 of the book by I. S. Gradshteyn and I. M. Ryzhik, *Table of Integrals, Series and Products*, Academic Press, New York, 1980, it can be seen that this situation is verified. Hence, for $n=1$ a magnetic field of constant gradient is approached as the length of the coil is increased. For other values of n, the coefficients approach zero as the length of the coil is increased.

It is useful to characterize the number of winding turns per unit length as a function of the normalized location of the cylindrical winding along the cylindrical surface by a dimensionless shape function, $\sigma_\phi(Z)$. Then the surface current density $\lambda$ can be expressed as $$\lambda_\phi = \frac{N_t I}{a w_a} \sigma_\phi(Z) \quad (16)$$

$$\lambda_z = \frac{I}{2\pi a} \quad (17)$$

where $$\sigma_\phi(-Z) = -\sigma_\phi(Z) \quad (18)$$

and $$w_a = \int_{-Z_m}^{Z_m} |\sigma_\phi(Z)| \, dZ. \quad (19)$$

For these equations, $Z=z/a$ is the normalized location of the cylindrical winding along the cylindrical surface, a is the radius of the coil, $2aZ_m$ is the total length of the coil, I is the current flowing through the winding, and $N_t$ is the total number of turns without regard to sign. Using the expression for the field $B_z$ given in Equation 12 and the function $f_n(Z)$ defined by Equation 15, the expansion coefficients $A_{0n}$ can be written as $$A_{0n} = \frac{\mu_0 N_t I}{2a^{n+1} w_a} \int_{-Z_m}^{Z_m} \sigma(Z) f_n(Z) \, dZ. \quad (20)$$

The gradient $G_z$ of the field $B_z$ can be found at the origin by differentiating the expansion for $B_z$ given by Equation 12 and setting $z=0$. Since $rP_1(\cos\theta)=z$, the result is $$G_z = \frac{dB_z}{dZ}\bigg|_{z=0} = \frac{\mu_0 N_t I}{2a^2 w_a} \int_{-Z_m}^{Z_m} \sigma(Z) f_1(Z) \, dZ = A_{01}. \quad (21)$$

It is convenient to normalize $\sigma_\phi(Z)$ by taking $$\int_{-Z_m}^{Z_m} \frac{3Z \sigma_\phi(Z)}{(1+Z^2)^{5/2}} \, dZ = 1. \quad (22)$$

With this normalization $$G_z = \frac{\mu_0 N_t I}{2a^2 w_a} \quad (23)$$

The current density given by Equations 16 and 17 is for a continuous distribution of current on the surface of the cylinder. The desired current density can be closely approximated by spirally winding a continuous wire around the outside surface of the cylinder. The best location for a discrete wire approximation to the desired continuous current density is to place the wires along the streamlines of the continuous distribution. The location of the wires is then the spiral path determined by integrating the differential equation $$\frac{d\phi}{dZ} = \frac{\lambda_\phi}{\lambda_z}. \quad (24)$$

Substituting Equations 16 and 17 into Equation 24, $$\frac{d\phi}{dZ} = \frac{2\pi N_t}{w_a} \sigma_\phi(Z). \quad (25)$$

With Equation 23 rewritten as $$N_t = \frac{2a^2}{\mu_0} \frac{G_z}{I} w_a \quad (26)$$

and combining Equation 26 with Equation 25, the result is obtained that $$\frac{d\phi}{dZ} = \frac{4\pi a^2}{\mu_0} \frac{G_z}{I} \sigma_\phi(Z). \quad (27)$$

with the normalization given by Equation 22, the shape function $\sigma_\phi(Z)$ is $$\sigma_\phi(Z) = \frac{(1+Z_m^2)^{3/2}}{2Z_m^3} Z \, (-Z_m < Z < Z_m). \quad (28)$$

With the shape function given by Equation 28, the magnetic field gradient is progressively more linear as the coil length is increased. In the limit, as $Z_m$ goes to infinity, the field gradient becomes perfectly linear.

In practice, the coil must be terminated. Many methods exist for terminating the coil in order to preserve the linearity of the field as much as possible. For $Z_m > 1$ the non-linearity in the magnetic field is due mostly to the $A_{03}$ term. Thus, the linearity can be greatly improved by superimposing on the linear winding density coil a discrete winding located so as to cancel that term. If this discrete coil is located at $Z>1$ it will have relatively little effect on the higher order terms $A_{05}$, $A_{07}$, etc. They will remain near the low value produced by the linear coil. To analyze the properties of an elementary circular coil, z is used for the field coordinate and $Z_0$ is used as the source coordinate. Variables denoted by capital letters are again used for the normalized variables. Because of the cylindrical symmetry, it is only necessary to consider the fields along the z-axis. The entire harmonic expansion for all positions can be determined by fitting fields along the z-axis. The field of a circular loop containing N turns at $Z_0$ is given by $$B_z = \frac{\mu_0 N I}{2a} \left( \frac{1}{[1+(Z-Z_0)^2]^{3/2}} \right). \quad (29)$$

A magnetic gradient field is produced by placing two such coils at $\pm Z_0$ with oppositely directed currents. For two coils in this configuration, the current density $\lambda$ is $$\lambda = NI\{\delta(z-z_0) - \delta(z+z_0)\}, \quad (30)$$

where $\delta$ is the Dirac delta function, and the magnetic field $B_z$ is $$B_z = \frac{\mu_0 N I}{2a} \left( \frac{1}{[1+(Z-Z_0)^2]^{3/2}} - \frac{1}{[1+(Z+Z_0)^2]^{3/2}} \right). \quad (31)$$

The $B_z$ field can be expanded as $$B_z = \frac{\mu_o NI}{a} \frac{Z_o}{(1+Z_o^2)^{5/2}} \left\{ 3Z + \frac{5}{2} \frac{(4Z_o^2 - 3)}{(1+Z_o^2)^2} Z^3 + \right.$$

$$\frac{21}{8} \frac{8Z_o^4 - 20Z_o^2 + 5}{(1+Z_o^2)^4} Z^5 +$$

$$\left. \frac{9}{16} \frac{64Z_o^6 - 336Z_o^4 + 280Z_o^2 - 35}{(1+Z_o^2)^6} Z^7 + \ldots \right\} . \quad (32)$$

The first term of Equation 32 represents the desired gradient field and all of the higher order terms are undesirable contaminants. The expression for the derivative in the z-direction of the $B_z$ field of Equation 32 is $$G_z = \frac{\partial B_z}{\partial z} = \quad (33)$$

$$-\frac{3}{2} \frac{\mu_o NI}{a^2} \left\{ \frac{Z - Z_o}{[1 + (Z - Z_o)^2]^{5/2}} - \frac{Z + Z_o}{[1 + (Z + Z_o)^2]^{5/2}} \right\} .$$

The series expansion of Equation 33 is $$G_z = \frac{\partial B_z}{\partial z} = \frac{\mu_o NI}{a^2} \frac{3Z_o}{[1 + Z_o^2]^{5/2}} \left\{ 1 + \right. \quad (34)$$

$$\frac{5}{2} \frac{(4Z_o^2 - 3)}{(1+Z_o^2)^2} Z^2 + \frac{35}{8} \frac{8Z_o^4 - 20Z_o^2 + 5}{(1+Z_o^2)^4} Z^4 +$$

$$\left. \frac{21}{16} \frac{64Z_o^6 - 336Z_o^4 + 280Z_o^2 - 35}{(1+Z_o^2)^6} Z^6 + \ldots \right\} .$$

At the origin, the gradient produced is $$G_z = \frac{\partial B_z}{\partial z} \bigg|_{z=0} = \frac{\mu_o NI}{a^2} \frac{3Z_o}{[1+Z_o^2]^{5/2}} . \quad (35)$$

Thus, the field gradient produced by two coils in this configuration is zero for $Z_0 = 0$, increases to a maximum at $Z_0 = 0.5$, and then gradually decreases to zero for $Z_0$ very large.

From Equation 9, it can be seen that the current density of the linear winding density coil can be expressed as $$\lambda = \alpha Z \quad (36)$$

where the constant $\alpha$ has the dimensions of amperes per meter. The coil is assumed to extend from $-Z_m$ to $Z_m$ along the z-axis. A strip of width $\Delta z$ will carry a current given by $$\Delta I = \lambda a \Delta Z. \quad (37)$$

It is useful to define an effective ampere-turn count for the coil by the formula $$(NI)^{eff} = \int_0^{Z_m} \lambda a dZ = \frac{\alpha a Z_m^2}{2} . \quad (38)$$

Along the z-axis the field of the linear winding density coil can be found by using $Z_0$ as a weighting factor and integrating Equation 29, so that $$B_z = \frac{\mu_o (NI)^{eff}}{a Z_m^2} \int_{-Z_m}^{Z_m} \frac{Z_o dZ_o}{[1 + (Z - Z_o)^2]^{3/2}} . \quad (39)$$

The result is $$B_z = \frac{\mu_o (NI)^{eff}}{a Z_m^2} \left\{ \frac{ZZ_m - (1 + Z^2)}{[1 + (Z - Z_m)^2]^{\frac{1}{2}}} + \frac{ZZ_m + (1 + Z^2)}{[1 + (Z + Z_m)^2]^{\frac{1}{2}}} \right\}, \quad (40)$$

which can be expanded as $$B_z = \frac{\mu_o (NI)^{eff}}{a} \frac{Z_m}{(1 + Z_m^2)^{3/2}} \left\{ 2Z - \frac{5}{(1 + Z_m^2)^2} Z^3 - \right. \quad (41)$$

$$\left. \frac{7}{4} \frac{4Z_m^2 - 5}{(1 + Z_m^2)^4} Z^5 - \frac{3}{8} \frac{24Z_m^4 - 84Z_m^2 + 35}{(1 + Z_m^2)^6} Z^7 + \ldots \right\} .$$

The magnetic field gradient can be found by differentiating Equation 41, so that $$G_Z = \frac{\partial B_z}{\partial z} = - \quad (42)$$

$$\frac{\mu_o (NI)^{eff}}{a^2 Z_m^2} \left\{ \frac{(Z - Z_m)^3 + Z}{[1 + (Z - Z_m)^2]^{3/2}} - \frac{(Z + Z_m)^3 + Z}{[1 + (Z + Z_m)^2]^{3/2}} \right\} ,$$

which can be expanded as $$G_Z = \frac{\partial B_z}{\partial z} = \frac{\mu_o (NI)^{eff}}{a^2} \frac{Z_m}{(1 + Z_m^2)^{3/2}} \left\{ 2 - \frac{15}{(1 + Z_m^2)^2} Z^2 - \right. \quad (43)$$

$$\frac{35}{4} \frac{4Z_m^2 - 5}{(1 + Z_m^2)^4} Z^4 -$$

$$\left. \frac{21}{8} \frac{24Z_m^4 - 84Z_m^2 + 35}{(1 + Z_m^2)^6} Z^6 + \ldots \right\} .$$

Thus, the value of the gradient at the origin is $$G_Z = \quad (44)$$

$$\frac{\partial B_z}{\partial z} \bigg|_{z=0} = \frac{2 \mu_o (NI)^{eff}}{a^2} \frac{Z_m}{(1 + Z_m^2)^{3/2}} = \frac{\mu_o \alpha}{a} \frac{Z_m^3}{(1 + Z_m^2)^{3/2}} .$$

It is again seen that, if $Z_m$ were permitted to become very large, all of the terms in Equations 43 and 44 except for the first would go to zero, and the field gradient would be a constant.

When the coil is terminated at a finite value of $Z_m$ and additional windings are added to compensate for the non-linearities resulting from such termination, the effect of placing coil pairs of appropriate ampere-turn values at appropriate positions along the cylindrical surface must by analyzed. Assuming that there are K such pairs, each of which has a strength, relative to the linear winding density coil, of $r_i$, such that $$r_i = \frac{(NI)_i}{(NI)^{eff}}, \tag{45}$$

the total magnetic field gradient produced by the coil and K correction pairs is $$G_z = \frac{\partial B_z}{\partial z} = -\frac{\mu_0(NI)^{eff}}{a^2}\left\{\frac{1}{Z_m^2}\left[\frac{(Z-Z_m)^3 + Z}{[1+(Z-Z_m)^2]^{3/2}} - \frac{(Z+Z_m)^2 + Z}{[1+(Z+Z_m)^2]^{3/2}}\right] + \sum_{i=1}^{K}\frac{3}{2} r_i\left[\frac{(Z-Z_o^{(i)})}{[1+(Z-Z_o)^2]^{5/2}} - \frac{(Z+Z_o^{(i)})}{[1+(Z+Z_o)^2]^{5/2}}\right]\right\} \tag{46}$$

Using Equations 34 and 43, Equation 46 can be written in the form of an expansion as $$G_Z = \frac{\mu_0(NI)^{eff}}{a^2} \sum_{n \text{ even}} \left[a_n z^n + \sum_{i=1}^{K} r_i b_n^{(i)} z^n\right]. \tag{47}$$

The condition that higher order terms be zero is $$\sum_{i=1}^{K} b_n^{(i)} r_i = -a_n. \tag{48}$$

Thus, by taking $n = 2, 4, \ldots, 2K$, a set of K linear equations can be formed to determine the $r_i$ that are necessary to eliminate the effects of any number of the higher order contaminating terms. The result is a system of a finite length coil and K filamentary pairs that can be used to produce a substantially constant gradient magnetic field. It is possible to extend the filamentary pairs to a finite width while preserving the compensation that they provide by a successive approximation technique similar to that suggested in the article by M. W. Garrett, "Thick Cylindrical Coil Systems for Strong Magnetic Fields with Field or Gradient Homogeneities of the 6th to 20th Order", *Journal of Applied Physics*, Vol. 38, pp. 2563–2586, 1967. One practical approach is to use two pairs of correction coils to eliminate the gradient contaminants proportional to $Z^2$ and $Z^4$. Of course, many such systems are possible. The applicant has found that a particularly useful coil system is described by the shape function $$\sigma_\phi(Z) = .5076 \, Z + H(Z) \quad (-1.5 < Z < 1.5), \tag{49}$$

-continued $$H(Z) = \begin{cases} 2.018 & 1.02 < Z < 1.26 \\ 0 & \text{otherwise} \\ -2.018 & -1.26 < Z < -1.02. \end{cases}$$

The coil inductance L is an important parameter, and it can be expressed as $$L = \frac{2\mu_0 N_f^2 a}{w_a^2} \int_{-Z_m}^{Z_m} \int_{-Z_m}^{Z_m} \frac{1}{k}\left\{\left(1 - \frac{k^2}{2}\right) K(k) - E(k)\right\} \sigma(Z_o)\sigma(Z'_o) dZ'_o dZ_o, \tag{50}$$

where the modulus k is defined by $$k^2 = \frac{4}{4 + (Z_o - Z'_o)^2} \tag{51}$$

and where the functions K and E are the complete elliptic integrals of the first and second kind, referred to at pages 291 and 335 of the aforementioned reference *Static and Dynamic Electricity*. Using the expression given by Equation 50, the inductance of the current sheet that comprises the linear gradient magnetic field coil can be calculated directly. However, doing so involves the double integration of elliptic functions, and the result is not especially useful. The inductance can also be calculated accurately by a less cumbersome method using a summation over loops of wire whose spacing is adjusted to correspond to the ideal current density of the coil. The spacing of discrete loops which corresponds to a surface current density proportional to z can be expressed as $$z_n = Z_m \sqrt{\frac{2n-1}{2N}} \quad (1 \leq n \leq N), \tag{52}$$

The inductance of such an array of discrete loops can be calculated as a double sum in the form $$L = 2N L_0 + \sum_{i=1}^{2N} \sum_{\substack{j=1 \\ j}}^{2N} M_{ij}. \tag{53}$$

In Equation 53 $L_0$ is the self inductance of an individual turn and $M_{ij}$ is the mutual inductance of turns i and j. Taking the radius of the wire from which the loop is wound to be $a_0$ $$L_0 = \mu_0 a \left\{\ln\left(\frac{8a}{a_0}\right) - \frac{7}{4}\right\} = \mu_0 a \ln\left(1.3902 \frac{a}{a_0}\right) \tag{54}$$

$$M_{ij} = \pm \frac{2\mu_0 a}{k}\left\{\left(1 - \frac{k^2}{2}\right) K - E\right\}$$

$$k^2 = \frac{4a^2}{4a^2 + (z_i - z_j)^2}.$$

The plus sign for $M_{ij}$ is to be used if the two loops are on the same side of the origin; otherwise, the minus sign is to be used.

Referring now to FIG. 1, one embodiment of a magnetic field gradient coil in accordance with the present invention is illustrated. Electrically conductive winding turns 104 are wound on the outer surface of cylindrical coil support structure 102 so that the axial density of winding turns 104 is at a minimum at the center of the length of coil support structure 102 and increases linearly from the center to each axial end of the coil. Winding turns 104 are wound so that they are symmetrically located about the center of coil support structure 102. In practice, winding turns 104 may be wound on support structure 102 by spirally winding wire from one axial end of support structure 102 to the other axial end thereof. The wire is wound so that the density of the winding turns decreases from each axial end of support structure 102 to the center of the length thereof. At the center, the direction of winding is reversed, as illustrated by reversing wire arc 106 in FIG. 1, so that winding turns 104 are symmetrically located about the center of support structure 102. Winding turns 104 are electrically insulated from each other in order to provide the desired current paths around the outer surface of cylindrical coil support structure 102. Terminal connection means 108 are used to connect wire winding turns 104 with a power supply (not shown in FIG. 1). Winding turns 104 may be made from any electrically conductive material, such as, for example, copper. Coil support structure 102 may be made from any material having sufficient strength and rigidity to be formed into a cylinder of the size required for a particular application. For example, support structure 102 may comprise glass fiber material.

In a preferred embodiment, winding turns 104 are further disposed so that the angular position $\phi$ of the spiral path of winding turns 104 on the surface of cylindrical support structure 102 satisfies the relationship determined by the equation $$\frac{d\phi}{dZ} = \frac{4\pi a^2}{\mu_o} \frac{G_z}{I} \sigma_\phi(Z), \qquad (55)$$

where a is the outer radius of coil support structure 102, $Z=Z/a$ is the normalized axial position along the axis of coil support structure 102, $\mu_o$ is the permeability of free space, $G_z$ is the value of the magnetic field gradient within the interior volume of coil support structure 102 in a direction parallel to the axis of the coil, I is the current flowing through winding turns 104, and $\sigma_\phi(Z)$ is a dimensionless shape function characterizing the number of winding turns 104 per unit length of coil support structure 102 as a function of the normalized position along the length of coil support structure 102. The coil illustrated by FIG. 1 provides a magnetic field having a substantially linear gradient in a direction parallel to the axis of coil support structure 102 when $$\sigma_\phi(Z) = \frac{(1 + z_m^2)^{3/2}}{2Z_m^3} Z (-Z_m < Z < Z_m), \qquad (56)$$

where $Z_m$ is half the length of coil support structure 102 divided by its radius. For example, a particularly useful coil may be made when $G_z$ is about 0.01 Tesla per meter, I is about 30 amperes, a is about 0.327 meters and $Z_m$ is about 2, such that the coil is characterized by $d\phi/dZ$ equal to about 356 $\sigma_\phi(Z)$, $\sigma_\phi(Z)$ equal to about 0.7Z, $\phi$ equal to about 124$Z^2$, and Z equal to about 0.09$\sqrt{\phi}$, and such that a total of about 160 of winding turns 104 are disposed symmetrically about the center of cylindrical support structure 102, with about 80 each of winding turns 104 located between the center of the length of coil support structure 102 and each axial end thereof.

FIG. 2 illustrates a coil having additional electrically conductive winding turns for compensating for variations in the linearity of the magnetic field gradient due to the finite length of the coil. The coil is essentially the same as the coil shown in FIG. 1, with the addition of compensating winding turns 202 and 204. Compensating winding turns 202 and 204 are spirally wound around the outer surface of coil support structure 102 such that the winding turn density of compensating winding turns 202 and 204 is constant for the portion of the length of coil support structure 102 where compensating winding turns are located. In the embodiment shown in FIG. 2, compensating winding turns 202 and 204 are wound in opposite directions around coil support structure 102, so that compensating winding turns 202 and 204 are each wound in the same direction as winding turns 104. However, compensating winding turns 202 and 204 may be wound in other directions as long as the current flowing through compensating winding turns 202 is oppositely directed from the current flowing through compensating winding turns 204. Also, as shown in FIG. 2, compensating winding turns 202 and 204 are each wound around coil support structure 102 before winding turns 104 are wound. However, compensating winding turns 202 and 204 may also be wound after winding turns 104 are wound. Compensating winding turns 202 are electrically insulated from each other and from compensating winding turns 204 and winding turns 104. Similarly, compensating winding turns 204 are electrically insulated from each other and from compensating winding turns 202 and and winding turns 104. Compensating winding turns 202 and 204 may be made from any electrically conductive material, such as, for example, copper. Compensating terminal connection means 206 connect compensating winding turns 202 to a power supply (not shown in FIG. 2). Similarly, compensating terminal connection means 208 connect compensating winding turns 204 to a separate power supply (also not shown).

In practice, the preferred method of including compensating winding turns in the coil is illustrated by FIG. 3. In the embodiment shown, the compensating winding turns are integrally incorporated with winding turns 104, so that current flows from one axial end of coil support structure 102 to the other by passing through both the winding turns and the compensating winding turns. The winding turns and the compensating winding turns are both spirally wound from the same wire, by winding the wire from one axial end of support structure 102 to the other axial end thereof. Similar to the embodiment shown in FIG. 1, the winding turn density of winding turns 104 in FIG. 3 decreases from each axial end of support structure 102 to the center thereof, where the direction of winding is reversed. In compensating winding regions 210 and 212, the winding turn density is increased in order to provide a compensating $B_Z$ field similar to that provided by separate compensating winding turns 202 and 204 shown in FIG. 2.

Preferably, the compensating winding turns are further disposed so that the angular position $\phi$ of the spiral path of the windings on the surface of coil support structure 102 satisfies the relationship determined by Equation 55 above, where the winding turn density is described by the shape function $$\sigma_\phi(Z) = 0.5076Z + H(Z)(-1.5 < Z < 1.5), \quad (57)$$

and where $$H(Z) = \begin{cases} 2.018 & 1.02 < Z < 1.26 \\ 0 & \text{otherwise} \\ -2.018 & -1.26 < Z < -1.02. \end{cases}$$

For example, and not by way of limitation, one especially useful coil may be made when $G_z$ is about 0.01 Tesla per meter, I is about 30 amperes, a is about 0.327 meters, and $Z_m$ is about 1.5, such that the coil is characterized by $d\phi/dZ$ equal to about $181Z + 356H(Z)$, and by $\phi$ equal to about $90Z^2$ for $|Z| < 1.02$, about $90Z^2 + 719Z - 733$ for $1.02 < |Z| < 1.26$, and about $90Z^2 + 173$ for $1.26 < |Z| < 1.50$, and such that the coil has a total of about 120 winding turns disposed symmetrically about the center of the coil, with about 15 winding turns located on each side of $Z=0$ between the points along the length of the coil which correspond to $Z=0$ and $Z=1.02$, about 35 winding turns similarly disposed on each side of $Z=0$ between the points corresponding to $Z=1.02$ and $Z=1.26$, and about 10 winding turns similarly disposed on each side of $Z=0$ between the points corresponding to $Z=1.26$ and $Z=1.50$.

For the preferred embodiments of coils in accordance with this invention, the electrically conductive windings comprise a uniform diameter wire having a diameter between about $$\frac{0.2aw_a}{N_t \sigma_\phi \max}$$

and $$\frac{aw_a}{N_t \sigma_\phi \max}$$

where $w_a$ is a shape-dependent coil parameter proportional to the gradient strength, defined as $$w_a = \int_{-Z_m}^{Z_m} |\sigma_\phi(Z)| dZ,$$

and where $N_t$ is the total number of winding turns and $\sigma_\phi \max$ is the largest value of $\sigma_{100}(Z)$ in the range $-Z_m < Z < Z_m$. If the wire diameter is too large it is preferable to wind the coil in multiple layers. If the wire diameter is too small, the inductance is increased above that calculated when it is assumed that the surface current density varies smoothly with position. Also, if the total number of turns $N_t$ is too small, then the smaller variations in $\sigma_{100}(Z)$ are not faithfully approximated. Hence a lower limit is placed on the total number of turns $N_t$. If $n_s$ is the number of turns per unit length, then $$\lambda_{100} = I n_s \quad (58)$$

Using Equation 16

$$n_s = \frac{N_t \sigma_\phi}{a w_a} \quad (59)$$

To accurately represent some feature of $\sigma_{100}(Z)$ that has a width 1 and an average value $<\sigma_\phi>$, the number of turns should be chosen such that $$N_t >> \frac{aw_a}{<\sigma_\phi> 1}. \quad (60)$$

For a particular value of $N_t$, a single layer winding can be produced and the expected inductance achieved if the wire diameter d is $$\frac{.2aw_a}{N_t \sigma_\phi^{max}} \lesssim d < \frac{aw_a}{N_t \sigma_\phi^{max}}. \quad (61)$$

The coils embodied by the present invention have reduced electrical inductance as compared to the inductance of a discrete pair of coils such as the Maxwell pair, because the total inductance of a distributed coil of the type employed in the instant invention is less than that of a discrete pair of coils. The inductance of any particular coil embodied by this invention can be calculated using Equations 53 and 54 above. For example, the inductance of a linear winding density coil having 104 turns between $-Z_m$ and $Z_m$ with $Z_m = 2.5$ is 2.22 millihenries. In comparison, the calculated inductance of a practical Maxwell pair with 52 turns per coil is 6.02 millihenries.

The coils embodied by the present invention may also include a protective material which covers the winding turns and the surface of the cylindrical coil support structure. As schematically depicted by the end view of FIG. 4, protective coating 110 typically covers winding turns 104 which are wound around coil support structure 102. Protective material 110 may be made from any material suitable to meet the requirements of a particular application, and may comprise, for example, epoxy.

FIG. 5 illustrates one embodiment of the manner in which the coils of the present invention may be used in a magnetic field generating system for nuclear magnetic resonance imaging. Cylindrical structure 302 represents a means for providing a uniform high strength magnetic field along the central axis of the system. In nuclear magnetic resonance imaging, structure 302 may comprise a superconducting magnet. Inside of cylindrical structure 302, and separated therefrom by gap 304, is coil structure 306. Coil structure 306 contains one of the coils embodied by the present invention as a means for providing a linearly graded magnetic field in the direction of the central axis of the magnetic field generating system. Coil structure 306 also includes means for providing linearly graded magnetic fields along two axes which are substantially orthogonal to the central axis and which are at a non-zero angle relative to each other. The means employed to provide these two orthogonal fields typically comprise saddle coils of the type shown and described in the technical report by P. A. Bottomley, "Instrumentation for Whole-Body NMR Imaging," General Electric Report No. 82 CRD 203, 1982.

FIG. 6 is a simplified block diagram showing the major components of an NMR imaging apparatus suitable for use with the magnetic field gradient coils of the present invention. The overall data handling system, generally designated 400, comprises general purpose computer 401 which is functionally coupled to disc storage unit 403, and interface unit 405. RF transmitter 402, signal averager 404, and gradient power supplies 406, 408, and 410 are coupled to computer 401 through interface unit 405. The three gradient power supplies are used for energizing, respectively, a set of X, Y, and Z gradient coils 416, 418 and 420.

RF transmitter 402 is gated with pulse envelopes from computer 401 to generate RF pulses having the required modulation to excite resonance in the sample being studied (imaged or spectroscopically analyzed). The RF pulses are amplified in RF power amplifier 412 to levels varying from 100 watts to several kilowatts, depending on the imaging method, and are applied to transmitter coil 424. Relatively high power levels are necessary for large sample volumes such as are encountered in whole body imaging, and where short duration pulses are required to excite large NMR frequency bandwidths.

The resulting NMR signal is sensed by receiver coil 426, amplified in low noise preamplifier 422, and thereafter routed to receiver 414 for further amplification, detection, and filtering. This NMR signal may then be digitized and averaged by signal averager 404, and routed to computer 401 for further processing. The processed signals are routed from computer 401 through interface 405 to display control unit 430 where they are stored, reformatted and applied to display unit 432. The display unit 432 may comprise CRT displays of the direct viewing storage tube (DVST) types, as well as conventional black and white or color television-like cathode ray tubes, which may include directly viewable calibration traces and the like.

Preamplifier 422 and receiver 414 are protected from the RF pulses during transmission by active disabling gating and/or by passive filtering. Computer 401 provides gating and envelope modulation for the NMR pulses, blanking for the preamplifier and RF power amplifier, and voltage waveforms for the gradient power supplies. Computer 401 also performs data processing such as Fourier transforms, image reconstruction, data filtering, image display, and storage functions, most of which are well known and do not form an intrinsic part of the present invention.

Transmitter and receiver RF coils may be configured as a single coil. Alternatively, two separate coils that are electrically orthogonal may be used. The latter configuration has the advantage of reduced RF pulse breakthrough into the receiver during the pulse transmission. In both cases, the coils are orthogonal to the direction of the static magnetic field $B_o$ produced by magnet 428. The coils are isolated from the remainder of the system by enclosure in an RF shielded cage (not shown). Three typical RF coil designs are illustrated as FIGS. 11a, 11b, and 11c in co-pending U.S. patent application Ser. No. 345,444, filed Feb. 3, 1982 now U.S. Pat. No. 4,471,306, issued Sept. 11, 1984, which is assigned to the instant assignee. All of the coils depicted therein produce RF magnetic fields in the x direction, and the coil designs illustrated in FIGS. 11b and 11c are suitable for magnetic geometries for which the axis of the sample chamber is parallel to the main field $B_o$. The coil design illustrated in FIG. 11a is applicable to geometries for which the sample chamber axis is perpendicular to main field $B_o$.

Magnetic field gradient coils 416, 418 and 420 necessary to provide the $G_x$, $G_y$ and $G_z$ gradient fields respectively. As discussed above, the gradient fields should be monotonic and linear over the sample volume. Non-monotonic gradient fields can cause a degradation in the NMR signal data, known as aliasing, which can lead to image artifacts. Nonlinear gradients can cause geometric distortions of the image. Coils embodied by the instant invention are employed to produce the $G_z$ gradient field. The gradient $G_x$ is produced by a set of coils such as the sets 300 and 302 depicted in FIG. 12a of the aforementioned application Ser. No. 345,444. The coil sets for producing gradient $G_y$ are rotated 90 degrees around the cylindrical axis of the sample chamber relative to the coil that produces the gradient $G_x$.

The foregoing describes a cylindrical coil for providing a magnetic field having a substantially linear gradient in an axial direction within the volume of the cylinder. The coil described uses distributed windings and has low electrical inductance. The present invention provides a cylindrical magnetic field gradient coil especially suitable for use with NMR apparatus.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A cylindrical coil for providing a magnetic field gradient varying substantially linearly in a direction parallel to the axis of said coil within the interior volume thereof, said coil comprising;

a non-magnetic cylindrical coil support structure having an open bore forming said interior volume, and a single electrically conductive cylindrical winding having a plurality of connected turns disposed on the surface of said coil support structure, said winding turns being electrically spaced from each other and symmetrically disposed about, and with the winding direction thereof being reversed at, the center of said cylindrical coil support structure with the axial density of said winding turns being at a minimum at the center of the length of said coil and linearly increasing from the center to each axial end of said coil; said winding turns forming, in the interior volume and responsive to the value of a current I caused to flow in a single common direction therethrough, an axial magnetic field with the desired substantially linearly varying gradient.

2. The coil of claim 1 wherein said electrically conductive winding turns are further disposed with the angular position $\phi$ of the location of any portion of said winding turns on the surface of said coil support structure satisfying the relationship determined by the equation $$\frac{d\phi}{dZ} = \frac{4\pi a^2}{\mu_o} \frac{G_z}{I} \sigma_\phi(Z),$$

where $a$ is the radius of said cylindrical coil support structure, $Z=Z/a$ is the normalized axial position along the axis of said cylindrical coil support structure, $\mu_0$ is the permeability of free space, $G_Z$ is the value of the magnetic field gradient within the interior volume of said coil in a direction parallel to said axis, I is the current flowing through said winding turns, and $\rho_\phi(Z)$ is a dimensionless shape function characterizing the number of said winding turns per unit length of said coil as a function of Z, where $$\sigma_\phi(Z) = \frac{(1 + z_m^2)^{3/2}}{2Z_m^3} Z(-Z_m < Z < Z_m),$$

and where $Z_m$ is half the length of said coil divided by its radius.

3. The coil of claim 1 wherein said cylindrical coil support structure comprises glass fiber material.

4. The coil of claim 1 further comprising a protective member disposed about said winding turns to cover said winding turns and said surface of said cylindrical support structure.

5. The coil of claim 2 wherein said electrically conductive winding turns comprise a uniform diameter wire wound around said cylindrical support structure as a spiral with the number of said winding turns per unit length varying with position and proportional to $\sigma_\phi(Z)$, with said wire diameter between about $$\frac{0.2aw_a}{N_t\sigma_\phi\text{max}}$$

and $$\frac{aw_a}{N_t\sigma_\phi\text{max}}$$

where $w_a$ is a shape-dependent coil parameter proportional to the gradient strength, defined as $$w_a = \int_{-Z_m}^{Z_m} |\sigma_\phi(Z)| dZ,$$

$N_t$ is the total number of said winding turns and $\sigma_\phi$ max is the largest value of $\sigma_\phi(Z)$ in the range $-Z_m < Z < Z_m$.

6. The coil of claim 2 wherein $G_z$ is 0.01 Tesla/meter, I is 30 amperes, a is 0.327 meters, and $Z_m$ is in 2, to cause said coil to be $d\phi/dZ$ equal to 356 $\sigma_\phi(Z)$, $\sigma_\phi(Z)$ is equal to is 0.7Z, $\phi$ equal to 124$Z^2$, and Z is equal to $0.09\sqrt{\phi}$, and with a total of 160 of said winding turns are disposed symmetrically the center of said cylindrical support structure, with about 80 each of said winding turns located between the center of the length of said coil support structure and each axial end thereof.

7. The coil of claim 1 further comprising additional electrically conductive winding turns for compensating for variations, due to said coil having finite length, in the linearity of the magnetic field gradient within said coil volume.

8. The coil of claim 7 wherein said additional compensating winding turns are disposed with the angular position $\phi$ of the location of any portion of said winding turns on the surface of said coil support structure satisfies the relationship determined by the equation $$\frac{d\phi}{dZ} = \frac{4\pi a^2}{\mu_o} \frac{G_z}{I} \sigma_\phi(Z),$$

where a is the radius of said cylindrical coil support structure, $Z = Z/a$ is the normalized axial position along the axis of said cylindrical coil support structure, $\mu_0$ is the permeability of free space, $G_z$ is the value of the magnetic field gradient within the interior volume of said coil in a direction parallel to said axis, I is the current flowing through said winding turns, and $\sigma_\phi(Z)$ is a dimensionless shape function characterizing the number of said winding turns per unit length of said coil as a function of Z, where $$\sigma_\phi(Z) = 0.5076Z + H(Z)(-1.5 < Z < 1.5),$$

and where $$H(Z) = \begin{cases} 2.018 & 1.02 < Z < 1.26 \\ 0 & \text{otherwise} \\ -2.018 & -1.26 < Z < -1.02. \end{cases}$$

9. The coil of claim 8 wherein $G_z$ is 0.01 Tesla/meter, I is 30 amperes, a is 0.327 meters, and $Z_m$ is in 1.5, to cause said coil $d\phi/dZ$ to be equal to $181Z+356H(Z)$, and is $\phi$ equal to $90Z^2$ for $|Z| < 1.02$, $90Z^2+719Z-733$ for $1.02 < |Z| < 1.26$, and $90Z^2+173$ for $1.26 < |Z| < 1.50$, and with a total of 120 of said winding turns are disposed symmetrically about the center of the cylindrical support structure, with 15 of said winding turns located on each side of the center of the axial length of said coil support structure between the points along the length of said coil which correspond to $Z=0$ and $Z=1.02$, 35 of said winding turns and said additional compensating winding turns similarly disposed on each side of the center of the axial length of said coil support structure between the points corresponding to $Z=1.02$ and $Z=1.26$, and 10 winding turns similarly disposed on each side of the center of the axial length of said coil support structure between the point corresponding to $Z=1.26$ and $Z=1.50$.

10. In combination in a magnetic field generating system for nuclear magnetic resonance imaging:
  means for providing a uniform high strength magnetic field along the central axis of said system;
  means for providing a linearly graded magnetic field added to said uniform magnetic field in the direction of the central axis of said system, and comprising: a non-magnetic cylindrical coil support structure having an open bore forming an interior coil volume, said bore being essential devoid of permanent magnetic material during coil operation; and a single electrically conductive cylindrical winding having a plurality of connected turns disposed on the surface of the coil support structure, with the winding turns being electrically spaced from each other and symmetrically disposed about, and with the winding direction being reversed at, the center of the cylindrical coil support structure and with the axial density of the winding turns being at a minimum of the center of the length of the coil and linearly increasing from the center to each axial end of the coil; the winding turns forming, in the interior volume and responsive to the value of a current I caused to flow in a single common direction through the entire winding, an axial magnetic field with the desired substantially linearly varying gradient; and
  means for providing linearly gradient magnetic fields along two axes substantially orthogonal to said central axis and at a non-zero angle relative to each other, said graded magnetic fields along said orthogonal axis being combined with said uniform and graded magnetic field along said central axis, to from a three dimensional magnetic field system.

11. In combination in a magnetic field generating system for nuclear magnetic resonance imaging:

means for providing a uniform high strength magnetic field along the central axis of said system;

means for providing a linearly graded magnetic field added to said uniform magnetic field in the direction of the central axis of said system, and comprising: a non-magnetic cylindrical coil support structure having an open bore forming an interior coil volume, said bore being essential devoid of permanent magnetic material during coil operation; and a single electrically conductive cylindrical winding having a plurality of connected turns disposed on the surface of the coil support structure, with the winding turns being essentially spaced from each other and symmetrically disposed about, and with the winding direction being reversed at, the center of the cylindrical coil support structure and with the axial density of the winding turns being at a minimum of the center of the length of the coil and linearly increasing from the center to each axial end of the coil; and additional electrically conductive winding turns for compensating for variations, due to said coil having finite length, in the linearity of the magnetic field gradient within the coil volume; all of the winding turns forming, in the interior volume and responsive to the value of a current I caused to flow in a single common direction through the entire winding, an axial magnetic field with the desired substantially linearly varying gradient; and means for providing linearly graded magnetic fields along two axes substantially orthogonal to said central axis and at a non-zero angle relative to each other, said graded magnetic fields along said orthogonal axis being combined with said uniform and graded magnetic field along said central axis, to form a three-dimensional magnetic field system.

12. In combination in a nuclear magnetic resonance system for producing NMR images from a sample:

a magnetic field generating system comprising:

means for providing a uniform high strength magnetic field along the central axis of said system; and means for providing a linearly graded magnetic field added to said uniform magnetic field in the direction of the central axis of said system, and comprising: a non-magnetic cylindrical coil support structure having an open bore forming an interior coil volume, said bore being essential devoid of permanent magnetic material during coil operation; and a single electrically conductive cylindrical winding having a plurality of connected turns disposed on the surface of the coil support structure, with the winding turns being electrically spaced from each other and symmetrically disposed about, and with the winding direction being reversed at, the center of the cylindrical coil support structure and with the axial density of the winding turns being at a minimum of the center of the length of the coil and linearly increasing from the center to each axial end of the coil; the winding turns forming, in the interior volume and responsive to the value of a current I caused to flow in a single common direction through the entire winding, an axial magnetic field with the desired substantially linearly varying gradient;

means for generating and transmitting radio frequency signals having the required modulation to excite, in cooperation with the total magnetic field impingent upon said sample, nuclear resonance in the sample being imaged;

processing means responsive to the NMR signals resulting from said resonance, for receiving and processing said NMR signals; and means responsive to said processing means for generating images from said processed NMR signals.

13. In combination in a nuclear magnetic resonance system for producing NMR images from a sample:

a magnetic field generating system comprising:

means for providing a uniform high strength magnetic field along the central axis of said system; and means for providing a linearly graded magnetic field added to said uniform magnetic field in the direction of the central axis of said system, and comprising: a non-magnetic cylindrical coil support structure having an open bore forming an interior coil volume, said bore being essential devoid of permanent magnetic material during coil operation; and a single electrically conductive cylindrical winding having a plurality of connected turns disposed on the surface of the coil support structure, with the winding turns being electrically spaced from each other and symmetrically disposed about, and with the winding direction being reversed at, the center of the cylindrical coil support structure and with the axial density of the winding turns being at a minimum of the center of the length of the coil and linearly increasing from the center to each axial end of the coil; and additional electrically conductive winding turns for compensating for variations, due to said coil having finite length, in the linearity of the magnetic field gradient within the coil volume; all of the winding turns forming, in the interior volume and responsive to the value of a current I caused to flow in a single common direction through the entire winding, an axial magnetic field with the desired substantially linearly varying gradient;

means for providing linearly graded magnetic fields along two axes substantially orthogonal to said central axis and at a non-zero angle relative to each other, said graded magnetic fields along said orthogonal axis being combined with said uniform and graded magnetic field along said central axis, to form a three-dimensional magnetic field system;

means for generating and transmitting radio frequency signals having the required modulation to excite, in cooperation with the total magnetic field impingement upon said sample, nuclear resonance in the sample being imaged;

processing means responsive to the NMR signals resulting from said resonance, for receiving and processing said NMR signals; and means responsive to said processing means for generating images from said processed NMR signals.

* * * * *